United States Patent
Lin et al.

(10) Patent No.: US 8,981,501 B2
(45) Date of Patent: Mar. 17, 2015

(54) SEMICONDUCTOR DEVICE AND METHOD OF FORMING THE SAME

(71) Applicant: United Microelectronics Corp., Hsinchu (TW)

(72) Inventors: Meng-Jia Lin, Changhua County (TW); Chang-Sheng Hsu, Hsinchu (TW); Kuo-Hsiung Huang, Hsinchu County (TW); Wei-Hua Fang, Kaohsiung (TW); Shou-Wei Hsieh, Hsinchu (TW); Te-Yuan Wu, Hsinchu (TW); Chia-Huei Lin, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/870,706

(22) Filed: Apr. 25, 2013

(65) Prior Publication Data

US 2014/0319693 A1  Oct. 30, 2014

(51) Int. Cl.
  *H01L 29/84* (2006.01)
  *H01L 21/311* (2006.01)
  *H01L 23/48* (2006.01)
  *B81C 1/00* (2006.01)
  *H01L 27/06* (2006.01)

(52) U.S. Cl.
  CPC ........ H01L 21/31116 (2013.01); H01L 23/481 (2013.01); B81C 1/00246 (2013.01); H01L 27/0617 (2013.01); H01L 2924/0002 (2013.01)
  USPC ........... 257/419; 257/254; 257/415; 257/416; 257/737; 257/774; 257/E21.211; 257/E21.249; 257/E23.145; 257/E29.324; 438/48; 438/53

(58) Field of Classification Search
  CPC ............ H01L 21/31116; H01L 23/481; H01L 27/0617; H01L 2924/0002; B81C 1/00246
  USPC ................. 257/254, 415, 416, 419, 737, 774, 257/E21.211, E21.249, E23.145, E29.324; 438/48, 53
  See application file for complete search history.

(56) References Cited

U.S. PATENT DOCUMENTS

| | | |
|---|---|---|
| 5,573,679 A | 11/1996 | Mitchell et al. |
| 5,719,073 A | 2/1998 | Shaw et al. |
| 6,243,474 B1 | 6/2001 | Tai et al. |
| 6,265,328 B1 | 7/2001 | Henley et al. |
| 6,635,509 B1 | 10/2003 | Ouellet |
| 6,725,719 B2 | 4/2004 | Cardarelli |
| 6,806,593 B2 | 10/2004 | Tai et al. |
| 6,829,131 B1 | 12/2004 | Loeb et al. |
| 6,841,848 B2 | 1/2005 | MacNamara et al. |
| 6,872,902 B2 | 3/2005 | Cohn et al. |
| 6,887,391 B1 | 5/2005 | Daneman et al. |
| 6,936,524 B2 | 8/2005 | Zhu et al. |
| 6,943,448 B2 | 9/2005 | Gabriel et al. |

(Continued)

*Primary Examiner* — Dao H Nguyen
(74) *Attorney, Agent, or Firm* — J.C. Patents

(57) ABSTRACT

A method of forming a semiconductor device is disclosed. Provided is a substrate having at least one MOS device, at least one metal interconnection and at least one MOS device formed on a first surface thereof. A first anisotropic etching process is performed to remove a portion of the substrate from a second surface of the substrate and thereby form a plurality of vias in the substrate, wherein the second surface is opposite to the first surface. A second anisotropic etching process is performed to remove another portion of the substrate from the second surface of the substrate and thereby form a cavity in the substrate, wherein the remaining vias are located below the cavity. An isotropic etching process is performed to the cavity and the remaining vias.

16 Claims, 5 Drawing Sheets

(56) References Cited

U.S. PATENT DOCUMENTS

| | | |
|---|---|---|
| 6,946,728 B2 | 9/2005 | Chen et al. |
| 7,019,955 B2 | 3/2006 | Loeb et al. |
| 7,045,459 B2 | 5/2006 | Freidhoff |
| 7,049,051 B2 | 5/2006 | Gabriel et al. |
| 7,129,172 B2 | 10/2006 | Morrow et al. |
| 7,152,474 B2 | 12/2006 | Deb et al. |
| 7,202,101 B2 | 4/2007 | Gabriel et al. |
| 7,242,569 B2 | 7/2007 | Hunt et al. |
| 7,280,436 B2 | 10/2007 | Pedersen |
| 7,288,424 B2 | 10/2007 | Hunter et al. |
| 7,329,933 B2 | 2/2008 | Zhe et al. |
| 8,587,078 B2 * | 11/2013 | Huang et al. .................. 257/419 |
| 8,865,500 B2 * | 10/2014 | Huang et al. .................... 438/53 |
| 2001/0023086 A1 | 9/2001 | Park et al. |
| 2004/0122328 A1 | 6/2004 | Wang et al. |
| 2005/0014317 A1 | 1/2005 | Pyo |
| 2005/0076719 A1 | 4/2005 | Jakobsen et al. |
| 2005/0162806 A1 | 7/2005 | Sarkar et al. |
| 2005/0221529 A1 | 10/2005 | Bang et al. |
| 2006/0223329 A1 | 10/2006 | Martin et al. |
| 2006/0260401 A1 | 11/2006 | Xie |
| 2007/0003082 A1 | 1/2007 | Pedersen |
| 2007/0007858 A1 | 1/2007 | Sorensen et al. |
| 2007/0023851 A1 | 2/2007 | Hartzell et al. |
| 2007/0040270 A1 | 2/2007 | Coenen |
| 2007/0047900 A1 | 3/2007 | Sampsell et al. |
| 2007/0054205 A1 | 3/2007 | Lin et al. |
| 2007/0125161 A1 | 6/2007 | Bryzek et al. |
| 2007/0187793 A1 | 8/2007 | Moon et al. |
| 2007/0284682 A1 | 12/2007 | Laming et al. |
| 2008/0094686 A1 | 4/2008 | U'Ren |
| 2008/0137884 A1 | 6/2008 | Kim et al. |
| 2008/0163687 A1 | 7/2008 | Kranz et al. |
| 2008/0304681 A1 | 12/2008 | Langlois et al. |
| 2009/0180655 A1 | 7/2009 | Tien et al. |
| 2009/0243004 A1 | 10/2009 | Lan et al. |
| 2009/0302415 A1 | 12/2009 | Mueller et al. |
| 2010/0002894 A1 | 1/2010 | Lan et al. |
| 2010/0044147 A1 * | 2/2010 | Wang ............................ 181/164 |
| 2010/0052179 A1 | 3/2010 | Lan et al. |
| 2010/0067728 A1 | 3/2010 | Chen |
| 2010/0074458 A1 | 3/2010 | Lan et al. |
| 2010/0084735 A1 | 4/2010 | Yang |
| 2010/0090298 A1 | 4/2010 | Shih et al. |
| 2010/0144156 A1 | 6/2010 | Shih |
| 2010/0270628 A1 | 10/2010 | Shih |
| 2011/0006350 A1 | 1/2011 | Shih |
| 2011/0012227 A1 | 1/2011 | Yang |
| 2011/0031624 A1 | 2/2011 | Lan et al. |
| 2011/0068374 A1 * | 3/2011 | Tan et al. ...................... 257/254 |
| 2011/0241137 A1 * | 10/2011 | Huang et al. .................. 257/419 |
| 2011/0248364 A1 * | 10/2011 | Huang et al. .................. 257/416 |
| 2011/0300659 A1 * | 12/2011 | Hsieh et al. ..................... 438/53 |

* cited by examiner

SEMICONDUCTOR DEVICE AND METHOD OF FORMING THE SAME

BACKGROUND OF THE INVENTION

1. Field of Invention

The present invention relates to a semiconductor device and a method of forming the same, and more generally to a semiconductor device having a micro-electromechanical system (MEMS) device and a method of forming the same.

2. Description of Related Art

A MEMS device is a device fabricated by using a micromachining technique. Due to its advantages of light weight and small size, the MEMS device well satisfies the current requirements for light, thin, short, and small electronic products, and is studied in many fields. The existing MEMS devices include accelerometers, switches, capacitors, sensors, microphones, and other ultra small-sized electromechanical devices.

MEMS microphones fabricated by using the MEMS technique have advantages of light weight, small size, and desirable signal quality, and therefore become the mainstream of miniature microphones. In the process of forming a MEMS microphone, after a MOS device and a MEMS device are formed on a substrate, a portion of the substrate at the backside of the MEMS device is removed to form a cavity therein. However, silicon grass is often observed after the cavity forming step. Such silicon grass is undesirable and may deteriorate the MEMS performance.

SUMMARY OF THE INVENTION

Accordingly, the present invention provides a method of forming a semiconductor device for suppressing formation of silicon grass, so that the semiconductor structure formed therefrom is free of silicon grass and has a better MEMS performance over competitors.

The present invention provides a method of forming a semiconductor device. Provided is a substrate having at least one MOS device, at least one metal interconnection and at least one MOS device formed on the first surface thereof. A first anisotropic etching process is performed to remove a portion of the substrate from the second surface of the substrate and thereby form a plurality of vias in the substrate, wherein the second surface is opposite to the first surface. A second anisotropic etching process is performed to remove another portion of the substrate from the second surface of the substrate and thereby form a cavity in the substrate, wherein the remaining vias are located below the cavity. An isotropic etching process is performed to the cavity and the remaining vias.

According to an embodiment of the present invention, the step of performing the first and second anisotropic etching processes includes: forming a first mask layer on the second surface of the substrate, wherein the first mask layer has a first opening; forming a second mask layer on the first mask layer, wherein the second mask layer has a plurality of second openings exposing the second surface of the substrate; performing the first anisotropic etching process to remove the portion of the substrate by using the second mask layers as a mask, so as to form the vias; removing the second mask layer; and performing the second anisotropic etching process to remove the another portion of the substrate by using the first mask layer as a mask, so as to form the cavity.

According to an embodiment of the present invention, the first mask layer includes silicon oxide, silicon oxynitride or silicon nitride.

According to an embodiment of the present invention, the second mask layer includes photoresist.

According to an embodiment of the present invention, the isotropic etching process is performed to remove a polymer on sidewalls of the cavity and the remaining vias by using the first mask layer as a mask.

According to an embodiment of the present invention, the polymer is formed during the first anisotropic etching process or the second anisotropic etching process, or both.

According to an embodiment of the present invention, during the step of performing the first anisotropic etching process, an etching gas includes $SF_6$ and a protection gas includes $C_4F_8$, $CF_4$, $CHF_3$, $CH_2F_2$, $CH_3F$ or a combination thereof.

According to an embodiment of the present invention, during the step of performing the second anisotropic etching process, an etching gas includes $SF_6$ and a protection gas includes $C_4F_8$, $CF_4$, $CHF_3$, $CH_2F_2$, $CH_3F$ or a combination thereof.

According to an embodiment of the present invention, an etching gas includes $SF_6$, $O_2$ or a combination thereof during the step of performing the isotropic etching process.

According to an embodiment of the present invention, the total open area of the vias accounts for about 30-70% of the bottom area of the cavity.

The present invention further provides a semiconductor device including a substrate, at least one MOS device, at least one metal interconnection and at least one MEMS device. The substrate has a logic circuit region and a MEMS region. The MOS device is located on the first surface of the substrate in the logic circuit region. The metal interconnection is located on the first surface of the substrate and connects the MOS device. The MEMS device includes a membrane and is located on the first surface of the substrate in the MEMS region. The substrate further has at least one cavity and a plurality of vias therein. The cavity extends from the second surface of the substrate in a direction toward the first surface opposite to the second surface of the substrate. The vias extend from the bottom of the cavity in the direction toward the first surface of the substrate. Besides, the total open area of the vias accounts for about 30-70% of the bottom area of the cavity.

According to an embodiment of the present invention, the cavity has a middle portion greater than a bottom thereof or a top thereof.

According to an embodiment of the present invention, the middle portion of the cavity is closer to the top thereof rather than to the bottom thereof.

According to an embodiment of the present invention, the membrane is a single layer or a multi-layer structure.

In view of the above, in the present invention, the vias and cavity at the backside of the MEMS device are fabricated with two successive anisotropic etching processes and followed by one isotropic etching process. With such method, the conventional silicon grass is not observed and thus the MEMS performance can be further improved. Besides, it is easy and simple to integrate the method of the invention into the existing CMOS process, thereby achieving competitive advantages over competitors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
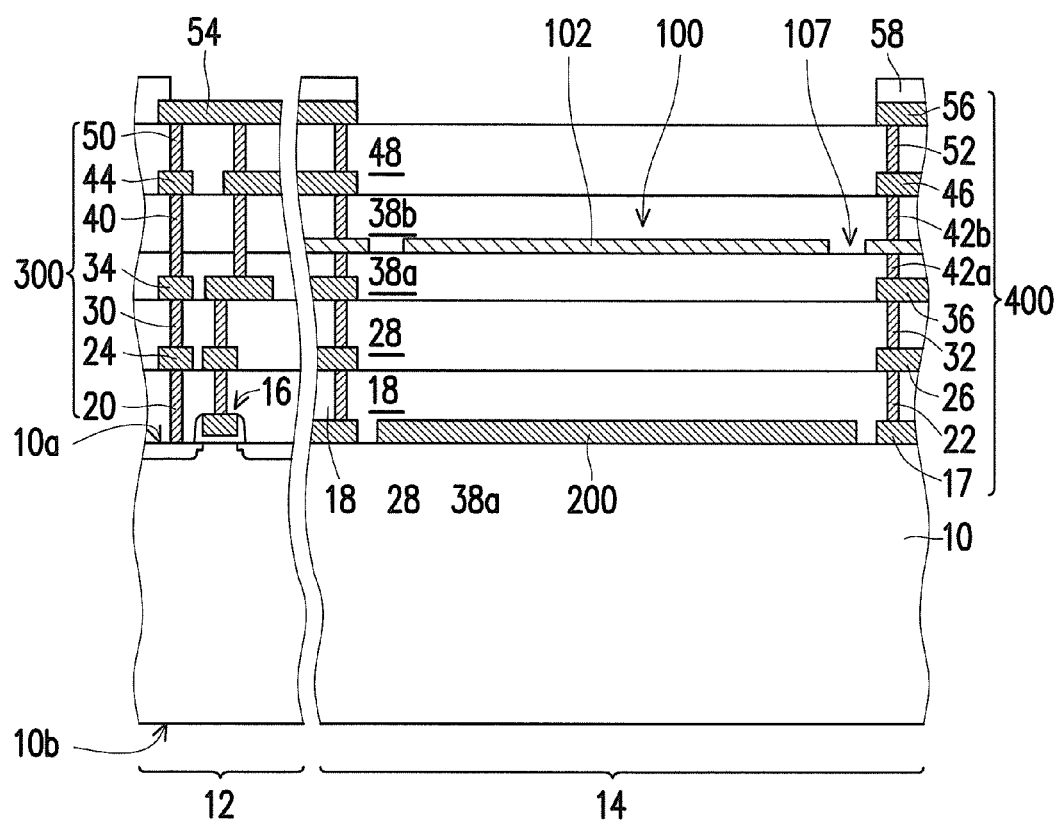
FIG. 1A to FIG. 1E are schematic cross-sectional views illustrating a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic cross-sectional views illustrating a method of forming a semiconductor device according to an embodiment of the present invention.

Referring to FIG. 1A, a substrate 10 having a logic circuit region 12 and a micro-electromechanical system (MEMS) region 14 is provided. The substrate 10 includes a semiconductor material, such as silicon or silicon germanium. The substrate 10 has a first surface 10a and a second surface 10b opposite to the first surface 10a. First, a front-end process is performed to form at least one MOS device 16 on the first surface 10a of the substrate 10 in the logic circuit region 12, and form an electrode 200 and a protection ring 17 on the first surface 10a of the substrate 10 in the MEMS region 14. The MOS device 16 can be an N-channel MOS device, a P-channel MOS device, or a CMOS device. The electrode 200 serves as an electrode of the MEMS device 100 such as a microphone. The annular protection ring 17 surrounds the MEMS region 14.

Thereafter, a back-end process is performed to form at least one metal interconnection 300 on the first surface 10a of the substrate 10 in the logic circuit region 12, and optionally form a protection wall 400 on the first surface 10a of the substrate 10 in the MEMS region 14. The protection wall 400 is for separating the logic circuit region 12 from the MEMS region 14. The structures of the metal interconnection 300 and the protection wall 400 in FIG. 1A are provided only for illustration purposes, and are not construed as limiting the present invention. Specifically, a dielectric layer 18 is formed on the substrate 10. Thereafter, conductive plugs 20 are formed in the dielectric layer 18 in the logic circuit region 12 to connect the MOS device 16, and an annular protection plug 22 is formed in the dielectric layer 18 in the MEMS region 14 to connect the protection ring 17. Afterwards, wires 24 are formed on the dielectric layer 18 in the logic circuit region 12 to connect the conductive plugs 20, and a protection ring 26 is formed on the dielectric layer 18 in the MEMS region 14 to connect the protection plug 22.

A dielectric layer 28 is then formed on the substrate 10. Next, conductive plugs 30 are formed in the dielectric layer 28 in the logic circuit region 12 to connect the wires 24, and an annular protection plug 32 is formed in the dielectric layer 28 in the MEMS region 14 to connect the protection ring 26. Furthermore, wires 34 are formed on the dielectric layer 28 in the logic circuit region 12 to connect the conductive plugs 30, and a protection ring 36 is foamed on the dielectric layer 28 in the MEMS region 14 to connect the protection plug 32.

Continue referring to FIG. 1A, a dielectric layer 38a is formed on the substrate 10. In an embodiment, the dielectric layer 38a is planarized through a chemical mechanical polishing (CMP) process. An annular protection plug 42a is then formed in the dielectric layer 38a in the MEMS region 14 to connect the protection ring 36. A membrane 102 of the MEMS device 100 is formed on the dielectric layer 38a in the MEMS region 14 to connect to the protection plug 42a. In an embodiment, the membrane 102 may have at least one opening 107 therein. The membrane 102 includes polysilicon, metal, oxide or a combination thereof and serves as another electrode of the MEMS device 100 such as a MEMS microphone. The membrane 102 can be a single layer or a multilayer structure. The membrane 102 can be a conductive layer or a dielectric layer or a combination thereof. The embodiment of FIG. 1A in which the membrane 102 is a single layer is provided for illustration purposes, and is not construed as limiting the present invention. In an embodiment (not shown), the membrane 102 can have a sandwich structure including a conductive layer fully wrapped by an oxide layer.

A dielectric layer 38b is formed on the substrate 10. Conductive plugs 40 are formed in the dielectric layers 38a and 38b in the logic circuit region 12 to connect the wires 34. An annular protection plug 42b is formed in the dielectric layer 38b in the MEMS region 14, and is disposed on and connected to the membrane 102. Wires 44 are formed on the dielectric layer 38b in the logic circuit region 12 to connect the conductive plugs 40. A protection ring 46 is formed on the dielectric layer 38b in the MEMS region 14 to connect the protection plug 42b.

Still referring to FIG. 1A, a dielectric layer 48 is formed on the substrate 10. Conductive plugs 50 are formed in the dielectric layer 48 in the logic circuit region 12 to connect the wires 44. An annular protection plug 52 is formed in the dielectric layer 48 in the MEMS region 14 and is electrically connected to the protection ring 46. A bonding pad 54 and an annular protection ring 56 are formed on the dielectric layer 48 respectively in the logic circuit region 12 and in the MEMS region 14. The bonding pad 54 is electrically connected to the conductive plugs 50. The protection ring 56 is electrically connected to the protection plug 52.

The wires 24, 34, 44 and the conductive plugs 20, 30, 40, 50 constitute the at least one metal interconnection 300 in the logic circuit region 12. The wires 24, 34 and 44 may be made of the same or different materials, for example, metal such as aluminum, tungsten, or any alloy thereof. The conductive plugs 20, 30, 40 and 50 may be made of the same or different materials, for example, metal such as aluminum, copper, tungsten, titanium, tantalum, a combination thereof, a nitride thereof or any alloy thereof.

The protection rings 17, 26, 36, 46, 56 and the protection plugs 22, 32, 42a, 42b, 52 all of which surround the MEMS region 14 constitute the protection wall 400 in the MEMS region 14. The protection rings 17, 26, 36, 46, 56 and the protection plugs 22, 32, 42a, 42b, 52 may be made of the same or different materials, for example, a doped polysilicon, metal silicide, or metal such as aluminum, tungsten, or any alloy thereof.

Besides, the dielectric layers 18, 28, 38a, 38b, 48 can be a single layer or a composite layer including different materials. The dielectric layers 18, 28, 38a, 38b, 48 may be made of the same or different materials, for example, silicon oxide or any material having a dielectric constant lower than 4, and formed by a chemical vapor deposition (CVD) process, a spin-on coating process or a suitable method.

Figure 1B:
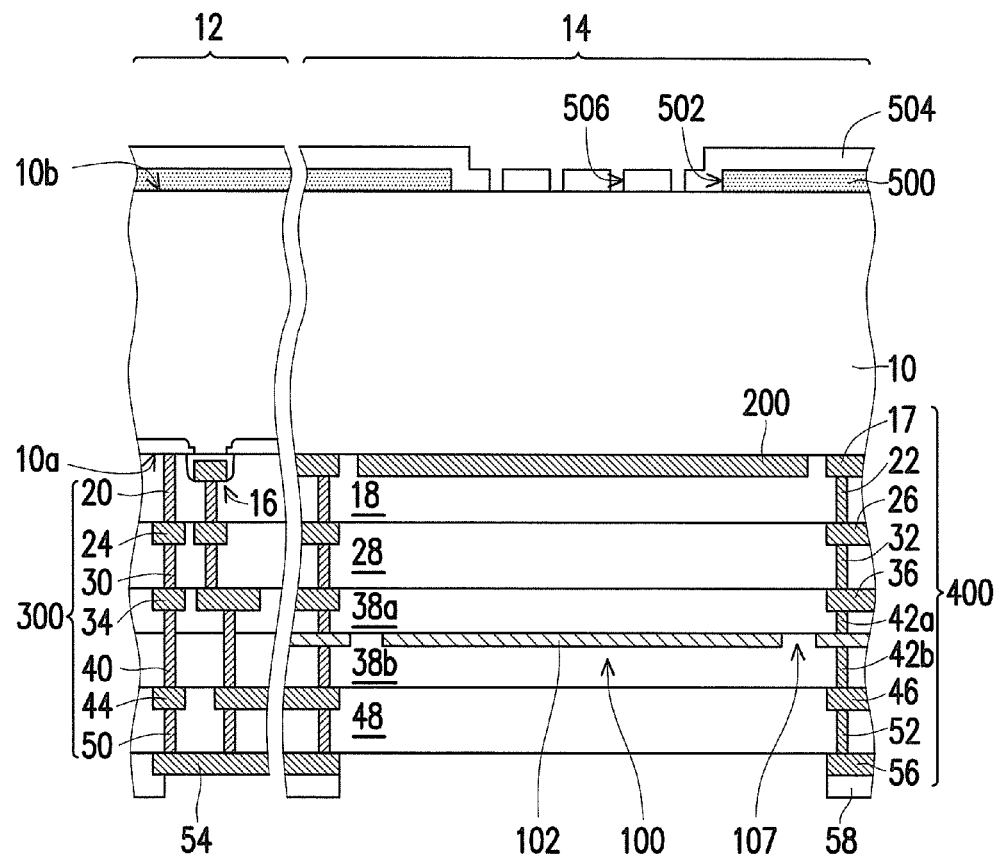

Referring to FIG. 1B, the substrate 10 is then disposed upside down, and a first mask layer 500 having a first opening 502 therein is formed on the second surface 10b of the substrate 10. The first mask layer 500 includes silicon oxide, silicon oxynitride or silicon nitride and the forming method thereof includes performing a CVD process or an ALD process. The first opening 502 is formed in the first mask layer 500 through photolithography and etching processes. Thereafter, a second mask layer 504 is formed on the first mask layer 500. The second mask layer 504 has a plurality of second openings 506 therein exposing the second surface 10b of the substrate 10. The second mask layer 504 includes photoresist and the forming method thereof includes performing a spin-coating process. The openings 506 are formed in the second mask layer 504 through a photolithography process.

Figure 1C:
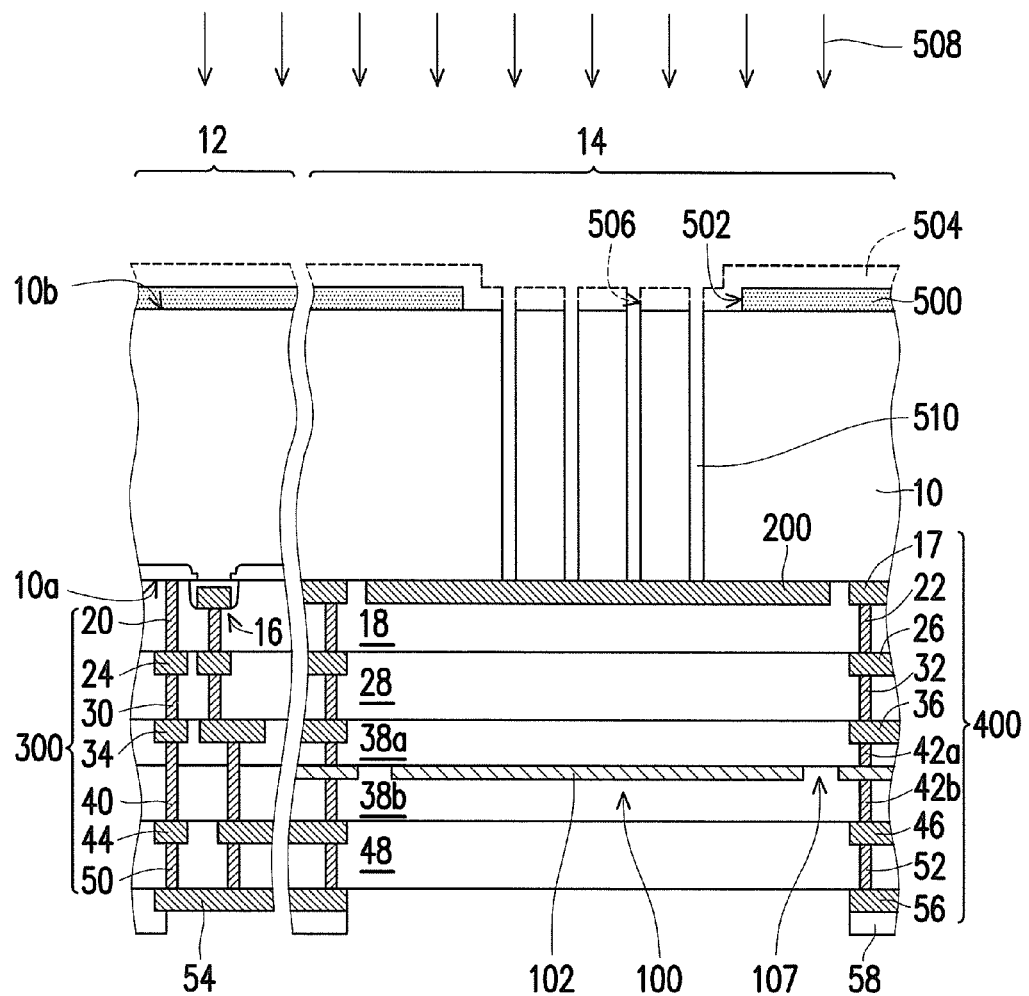

Referring to FIG. 1C, a first anisotropic etching process 508 is performed to remove a portion of the substrate 10 from the second surface 10b in the direction toward the first surface 10a of the substrate 10, using the second mask layers 504 as a mask, and thereby form a plurality of vias 510 in the substrate 10 in the MEMS region 14. In embodiment, the first anisotropic etching process 508 includes repeating an etching step and a deposition step as many times as desired. An etching gas used in the etching includes $SF_6$ and a protection gas used in the deposition step includes $C_4F_8$, $CF_4$, $O_2$, $CHF_3$, $CH_2F_2$, $CH_3F$ or a combination thereof. Specifically, the first anisotropic etching process 508 can include a deposition step (1), an $O_2$ boost step (2), a $SF_6$ boost step (3), an etching step (4) and an endpoint step (5). The deposition step (1) is for depositing a protective polymer on the target region. The $O_2$ boost step (2) and the $SF_6$ boost step (3) are for removing the protective polymer on the target region. The etch step (4) can be regarded as a main etching step for removing the substrate 10 in the target region. The endpoint step (5) is for detecting an endpoint of the etching step. The step (1) to step (5) can be repeated as needed.

In an embodiment, the process parameters such as time, pressure, gas species/flow rate, coil power, platen power and temperature of each step are listed in Table 1. The second mask layer 504 is removed after the first anisotropic etching process 508.

TABLE 1

| Step | Time (s) | Pressure (mT) | $C_4F_8$ (sscm) | $SF_6$ (sscm) | $O_2$ (sscm) | Coil Power (W) | Platen Power (W) | Temp. (° C.) |
|---|---|---|---|---|---|---|---|---|
| Deposition | 3 | 150 | 375 | 0 | 1 | 4500 | 30 | −5 |
| $O_2$ boost | 1.5 | 20 | 0 | 0 | 150 | 3000 | 175 | −5 |
| $SF_6$ boost | 1.5 | 25 | 0 | 300 | 0 | 3000 | 175 | −5 |
| Etch | 6 | 180 | 0 | 900 | 0 | 4500 | 30 | −5 |
| E/P | 1 | 25 | 0 | 50 | 0 | 4500 | 30 | −5 |

Figure 1D:
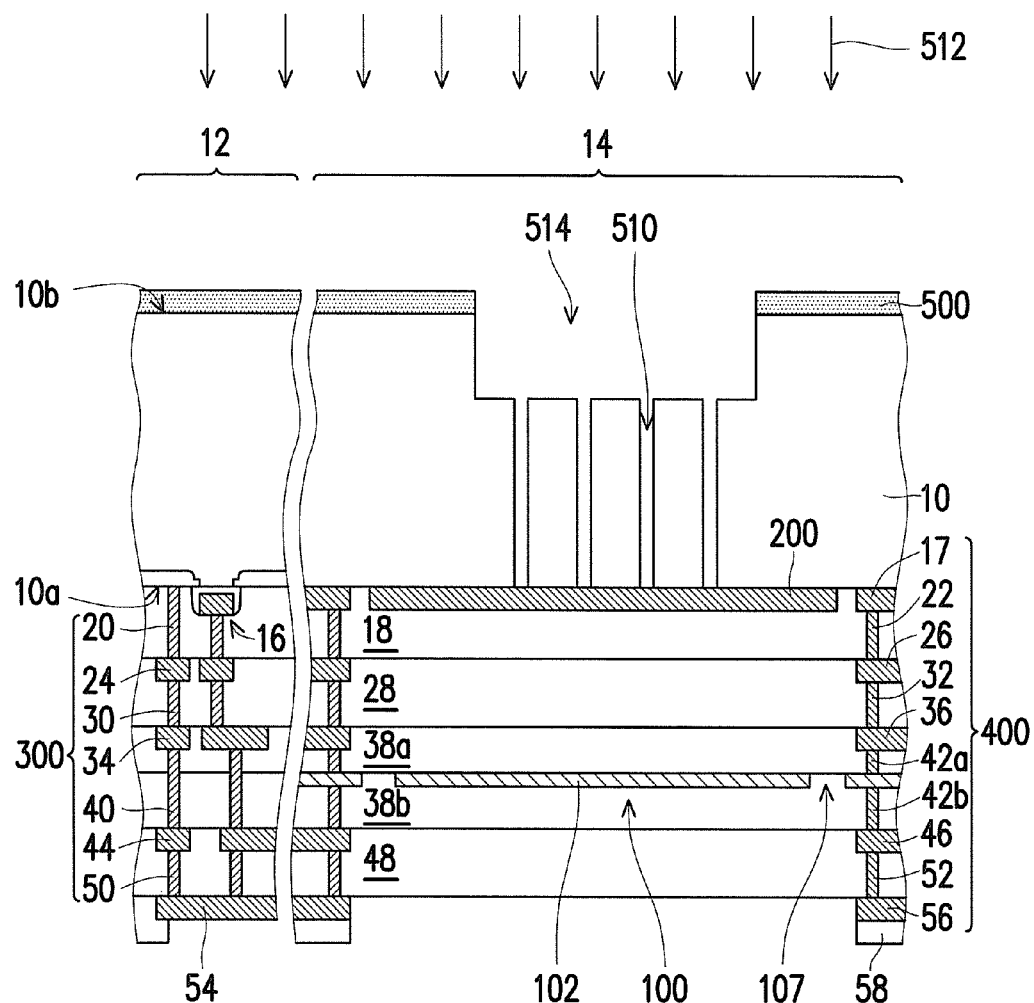

Referring to FIG. 1D, a second anisotropic etching process 512 is performed to remove another portion of the substrate 10 from the second surface 10b in the direction toward the first surface 10a of the substrate 10, using the first mask layer 500 as a mask, and thereby form a cavity 514 in the substrate in the MEMS region 14. The remaining vias 510 are located below the cavity 514. In embodiment, the second anisotropic etching process 512 includes repeating an etching step and a deposition step as many times as desired. An etching gas used in the etching includes $SF_6$, $O_2$ or a combination thereof and a protection gas used in the deposition step includes $C_4F_8$, $CF_4$, $CHF_3$, $CH_2F_2$, $CH_3F$ or a combination thereof. Specifically, the second anisotropic etching process 512 can include a deposition step (1), a $SF_6$ boost step (2) and an etching step (3). The deposition step (1) is for depositing a protective polymer on the target region. The $SF_6$ boost step (2) is for removing the protective polymer on the target region. The etch step (3) can be regarded as a main etching step for removing the substrate 10 in the target region. The step (1) to step (3) can be repeated as needed.

In an embodiment, the process parameters such as time, pressure, gas species/flow rate, coil power, platen power and temperature of each step are listed in Table 2.

TABLE 2

| Step | Time (s) | Pressure (mT) | $C_4F_8$ (sscm) | $SF_6$ (sscm) | $O_2$ (sscm) | Coil Power (W) | Platen Power (W) | Temp. (° C.) |
|---|---|---|---|---|---|---|---|---|
| Deposition | 3 | 100 | 150 | 0 | 0 | 2000 | 60 | −5 |
| $SF_6$ boost | 2 | 25 | 0 | 300 | 0 | 3000 | 170 | −5 |
| Etch | 7 | 120 | 0 | 500 | 50 | 3000 | 50 | −5 |

Figure 1E:
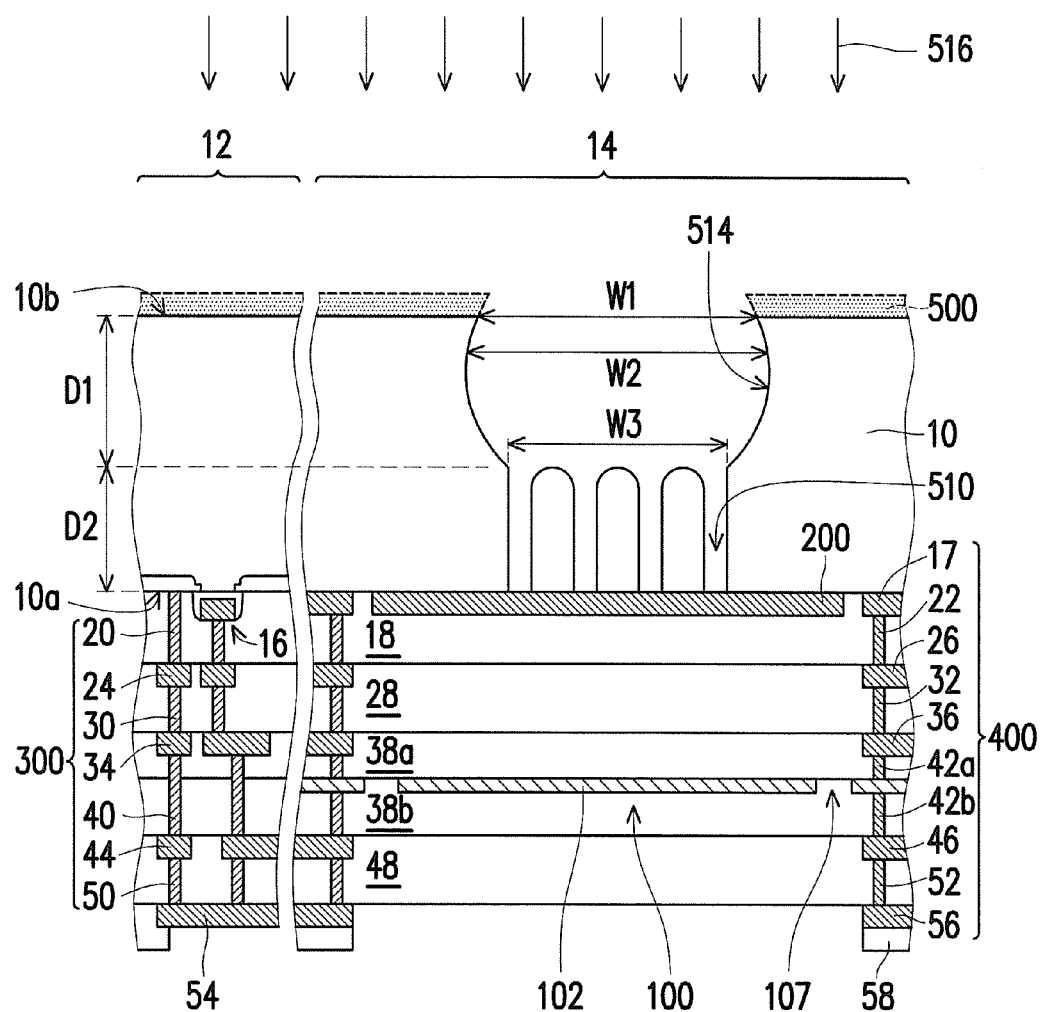

Referring to FIG. 1E, an isotropic etching process 516 is performed to the cavity 514 and the remaining vias 510. The isotropic etching process 516 is performed by using the first mask layer 500 as a mask. In embodiment, the isotropic etching process 516 includes a flare step for removing the polymer on sidewalls of the cavity 514 and the remaining vias 510. The polymer is formed during the first anisotropic etching process 508 or the second anisotropic etching process 512, or both. It is noted that the isotropic etching process 516 not only removes the polymer residues on the sidewalls of the vias 510 and the cavity 514 but also enlarges the middle portion of the cavity 514. During the flare step, the cavity 514 can be simultaneously deepened and each of the vias 510 can be simultaneously widened. The etching gas used in the flare step includes $SF_6$, $O_2$ or a combination thereof. Specifically, after the isotropic etching process 516, the cavity 514 has a middle portion between the top thereof and the bottom thereof, and the width W2 of the middle portion is the maximum width of the cavity 514. In an embodiment, the middle portion of the cavity 514 is closer to the top thereof rather than to the bottom thereof. In an embodiment, the width W1 of the top of the cavity 514 is close to, or even substantially equal to, the width W3 of the bottom of the cavity 514. In another embodiment, the width W1 of the top of the cavity 514 can be different from the width W3 of the bottom of the cavity 514.

In an embodiment, the process parameters such as time, pressure, gas species/flow rate, coil power, platen power and temperature of the isotropic etching process 516 are listed in Table 3.

TABLE 3

| Step | Time (s) | Pressure (mT) | $C_4F_8$ (sscm) | $SF_6$ (sscm) | $O_2$ (sscm) | Coil Power (W) | Platen Power (W) | Temp. (° C.) |
|---|---|---|---|---|---|---|---|---|
| Flare | 330 | 50 | 0 | 400 | 80 | 2000 | 50 | −5 |

Since the polymer residues on the sidewalls of the vias 510 and the cavity 514 are removed by the isotropic etching process 516, the conventional silicon grass is not observed after the isotropic etching process 516. In other words, the isotropic etching process 516 can be regarded as a silicon grass removing step. The first mask layer 500 is then removed after the isotropic etching process 516.

The subsequent processes such as removing at least a portion of the dielectric layers in the MEMS region 14 to suspend the membrane 102, die-cutting and packaging steps are known to persons skilled in the art and may not be described herein again.

The semiconductor structure of the present invention is illustrated with reference to FIG. 1E in the following. Referring to FIG. 1E, the semiconductor device of the present invention includes a substrate 10, at least one MOS device 16, at least one metal interconnection 300 and at least one MEMS device 100. The substrate 10 has a logic circuit region 12 and a MEMS region 14. The MOS device 16 is located on the first surface 10a of the substrate 10 in the logic circuit region 12. The metal interconnection 300 is located on the first surface 10a of the substrate 10 and connects the MOS device 16. The MEMS device 100 includes an electrode 200, a membrane 202 and a protection wall 400 and is located on the first surface 10a of the substrate 10 in the MEMS region 14. The membrane 202 can be a single layer or a multi-layer structure and includes polysilicon, metal, a dielectric material or a combination thereof.

The substrate 10 further has at least one cavity 514 and a plurality of vias 510 therein. The cavity 514 extends from the second surface 10b of the substrate 10 in a direction toward the first surface 10a opposite to the second surface 10b of the substrate 10. In an embodiment, the cavity 514 has a middle portion greater than the bottom or the top thereof. In an embodiment, the middle portion of the cavity 514 is closer to the top thereof rather than to the bottom thereof, as shown in FIG. 1E. Besides, the total open area of the vias 510 accounts for about 30~70% of the bottom area of the cavity 514.

In view of the above, in the present invention, the vias and cavity at the backside of the MEMS device are fabricated with two successive anisotropic etching processes and followed by one isotropic etching process. With such method, the conventional silicon grass is not observed and thus the MEMS performance can be further improved. Besides, it is easy and simple to integrate the method of the invention into the existing CMOS process, thereby achieving competitive advantages over competitors.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
   providing a substrate, having at least one MOS device, at least one metal interconnection and at least one MOS device formed on a first surface thereof;
   performing a first anisotropic etching process to remove a portion of the substrate from a second surface of the substrate and thereby form a plurality of vias in the substrate, wherein the second surface is opposite to the first surface;
   performing a second anisotropic etching process to remove another portion of the substrate from the second surface of the substrate and thereby form a cavity in the substrate, wherein the remaining vias are located below the cavity; and
   performing an isotropic etching process to the cavity and the remaining vias, so that the cavity has a middle portion greater than a bottom thereof or a top thereof, and the middle portion of the cavity is closer to the top thereof than the bottom thereof.

2. The method of claim 1, wherein the step of performing the first and second anisotropic etching processes comprises:
   forming a first mask layer on the second surface of the substrate, wherein the first mask layer has a first opening;
   forming a second mask layer on the first mask layer, wherein the second mask layer has a plurality of second openings exposing the second surface of the substrate;
   performing the first anisotropic etching process to remove the portion of the substrate by using the second mask layers as a mask, so as to form the vias;
   removing the second mask layer; and
   performing the second anisotropic etching process to remove the another portion of the substrate by using the first mask layer as a mask, so as to form the cavity.

3. The method of claim 2, wherein the first mask layer comprises silicon oxide, silicon oxynitride or silicon nitride.

4. The method of claim 2, wherein the second mask layer comprises photoresist.

5. The method of claim 2, wherein the isotropic etching process is performed to remove a polymer on sidewalls of the cavity and the remaining vias by using the first mask layer as a mask.

6. The method of claim 5, wherein the polymer is formed during the first anisotropic etching process or the second anisotropic etching process, or both.

7. The method of claim 1, wherein during the step of performing the first anisotropic etching process, an etching gas comprises $SF_6$ and a protection gas comprises $C_4F_8$, $CF_4$, $CHF_3$, $CH_2F_2$, $CH_3F$ or a combination thereof.

8. The method of claim 1, wherein during the step of performing the second anisotropic etching process, an etching gas comprises $SF_6$ and a protection gas comprises $C_4F_8$, $CF_4$, $CHF_3$, $CH_2F_2$, $CH_3F$ or a combination thereof.

9. The method of claim 1, wherein an etching gas comprises $SF_6$, $O_2$ or a combination thereof during the step of performing the isotropic etching process.

10. The method of claim 1, wherein a total open area of the vias accounts for 30~70% of a bottom area of the cavity.

11. A semiconductor device, comprising:
    a substrate, having a logic circuit region and a microelectromechanical system (MEMS) region;

at least one metal-oxide semiconductor (MOS) device, located on a first surface of the substrate in the logic circuit region;
at least one metal interconnection, located on the first surface of the substrate and connecting the MOS device; and
at least one MEMS device, comprising a membrane and located on the first surface of the substrate in the MEMS region,
wherein the substrate further has at least one cavity and a plurality of vias therein, the cavity extends from a second surface of the substrate in a direction toward the first surface opposite to the second surface of the substrate, and the vias extend from a bottom of the cavity in the direction toward the first surface of the substrate,
wherein the cavity has a middle portion greater than the bottom thereof or a top thereof, and the middle portion of the cavity is closer to the top thereof than the bottom thereof, and
wherein a total open area of the vias accounts for 30~70% of a bottom area of the cavity.

12. The semiconductor device of claim 11, wherein the membrane is a single layer or a multi-layer structure.

13. A semiconductor device, comprising:
a substrate, having a logic circuit region and a microelectromechanical system (MEMS) region;
at least one metal-oxide semiconductor (MOS) device, located on a first surface of the substrate in the logic circuit region;
at least one metal interconnection, located on the first surface of the substrate and connecting the MOS device; and
at least one MEMS device, comprising a membrane and located on the first surface of the substrate in the MEMS region,
wherein the substrate further has at least one cavity and a plurality of vias therein, the cavity has an arc sidewall extending from a second surface of the substrate in a direction toward the first surface opposite to the second surface of the substrate, and the vias extend from a bottom of the cavity in the direction toward the first surface of the substrate.

14. The semiconductor device of claim 13, wherein a middle portion greater than a bottom thereof or a top thereof, and the middle portion of the cavity is closer to the top thereof than the bottom thereof.

15. The semiconductor device of claim 13, wherein a total open area of the vias accounts for 30~70% of a bottom area of the cavity.

16. The semiconductor device of claim 13, wherein the membrane is a single layer or a multi-layer structure.

* * * * *